(12) United States Patent
Handa et al.

(10) Patent No.: US 7,812,530 B2
(45) Date of Patent: Oct. 12, 2010

(54) FLEXIBLE SUBSTRATE AND ORGANIC DEVICE USING THE SAME

(75) Inventors: Shinichi Handa, Tokyo-To (JP); Toru Miyake, Tokyo-To (JP); Hiroyoshi Nakajima, Tokyo-To (JP)

(73) Assignee: Dai Nippon Printing Co., Ltd., Shinjuku-Ku (JP)

(*) Notice: Subject to any disclaimer, the term of this patent is extended or adjusted under 35 U.S.C. 154(b) by 351 days.

(21) Appl. No.: 11/106,346

(22) Filed: Apr. 14, 2005

(65) Prior Publication Data

US 2005/0236985 A1 Oct. 27, 2005

(30) Foreign Application Priority Data

Apr. 16, 2004 (JP) ............... 2004-120946

(51) Int. Cl.
*H01J 1/62* (2006.01)
*H01J 63/04* (2006.01)
*B32B 9/00* (2006.01)

(52) U.S. Cl. .................. 313/511; 313/498; 313/506; 428/428; 428/429

(58) Field of Classification Search ............ None
See application file for complete search history.

(56) References Cited

U.S. PATENT DOCUMENTS

| | | | |
|---|---|---|---|
| 6,020,426 A * | 2/2000 | Yamaguchi et al. | 525/66 |
| 6,592,969 B1 * | 7/2003 | Burroughes et al. | 428/195.1 |
| 6,664,137 B2 * | 12/2003 | Weaver | 438/125 |
| 2003/0072932 A1 * | 4/2003 | Gandon | 428/212 |
| 2003/0077453 A1 * | 4/2003 | Oaku et al. | 428/415 |
| 2004/0071960 A1 * | 4/2004 | Weber et al. | 428/336 |
| 2005/0122039 A1 * | 6/2005 | Satani | 313/506 |
| 2006/0094859 A1 * | 5/2006 | Marrocco et al. | 528/394 |

FOREIGN PATENT DOCUMENTS

| | | |
|---|---|---|
| EP | 1 006 169 | 6/2000 |
| EP | 1006169 A1 * | 6/2000 |
| JP | 11-329715 | 11/1999 |
| JP | 2002-534305 | 10/2002 |
| JP | 2004-50565 | 2/2004 |

OTHER PUBLICATIONS

WPI Abstract, Acc. No. 1994-230561 & JP6166550 (Olympus)—see diagrams and English language abstracts.

* cited by examiner

*Primary Examiner*—Toan Ton
*Assistant Examiner*—Britt D Hanley
(74) *Attorney, Agent, or Firm*—Burr & Brown

(57) ABSTRACT

The present invention provides a flexible substrate, which has solvent resistance, a high level of gas barrier properties, a high level of flexibility, high heat resistance, and a high level of transparency, and is suitable, for example, for use in a wet coating process of an organic device material, and an organic device using the same. The flexible substrate comprises a metal oxide polymer-containing layer and a three-dimensionally crosslinked polymer layer stacked in that order on at least one side of a very thin glass. The metal oxide polymer is a silicon oxide polymer, and the metal oxide polymer-containing layer underlying the three-dimensionally crosslinked polymer layer is neither swollen nor dissolved in an aromatic organic solvent.

5 Claims, 1 Drawing Sheet

FLEXIBLE SUBSTRATE AND ORGANIC DEVICE USING THE SAME

RELATED APPLICATION

This application is a patent application claiming the benefit of priority based on Japanese Patent Application No. 120946/2004, the entire disclosure of which is incorporated herein.

TECHNICAL FIELD

The present invention relates to a flexible substrate suitable particularly for use in flexible flat display devices (flat displays) and the like and an organic device using the flexible substrate.

BACKGROUND ART

In recent years, flat displays are used in a number of fields and places, and advances in informatization has rendered them more and more important. At the present time, liquid crystal displays (hereinafter referred to as "LCDs") are representative of flat displays. Organic electroluminescence (hereinafter referred to as "organic EL"), inorganic electroluminescence (hereinafter referred to as "inorganic EL"), plasma display panels (hereinafter referred to as "PDP"), light emitting diode display devices (hereinafter referred to as "LED"), vacuum fluorescent display devices (hereinafter referred to as "VFD"), field emission display (hereinafter referred to as "FED") and the like are also under active development. All of these new flat displays are called "selfluminous type" and are greatly different from LCDs in the following points and have excellent features not possessed by LCDs. Among others, research in organic ELs is particularly actively made.

The organic ELs have advantages such as a high level of visibility by virtue of self-color development, excellent impact resistance because of a solid state display unlike a liquid crystal display, a high response speed, less susceptibility to a temperature change, and a high visible angle. In recent years, attention has been drawn to the utilization of organic ELs as a light emitting element in image display devices.

Regarding the method for EL layer formation, in general, when a low-molecular weight material is used as the material for the EL layer, a vacuum vapor deposition method using a mask is used, while, when a polymeric material is used, a solution is prepared from the material and is used for ink jet recording, spin coating, printing, transfer or the like to form the EL layer.

In recent years, coatable low-molecular materials are also reported. In the vacuum deposition of the low-molecular weight material using a mask among them, an increase in size of vacuum devices and vapor deposition masks is difficult. This makes it difficult to cope with an increase in size and to prepare a large number of organic EL elements using a large substrate. The above difficulty poses no problem in experimental preparation in a development stage. In a full-scale production stage, however, this is disadvantageous in market competitiveness from the viewpoints of tact and cost. On the other hand, for polymeric materials or coatable low-molecular weight materials, film formation by wet coating methods such as ink jet recording, printing, casting, alternate adsorption, spin coating, and dipping is possible and thus can cope with large substrates, and these are promising methods for organic EL element formation.

In the above flat displays including LCDs, a device element is usually formed on a glass substrate. The glass substrate is used because of its excellent transparency, optical isotropy, gas barrier properties, chemical resistance, smoothness, dimension stability and the like. The glass substrate, however, lacks in flexibility. Therefore, when the glass substrate is used, for example, in displays for small notebook-sized personal computers and portable terminals such as electronic notepads, the glass is sometimes damaged.

On the other hand, plastics have features such as flexibility, light weight, and possible long sheet processing in a roll form and have drawn attention as a substrate material for displays. When the plastic sheet is used solely, however, properties required of the above substrate material cannot be satisfied.

To overcome the above problem, in recent years, a composite structure comprising a flexible thin glass and a plastic has been proposed. For example, Japanese Patent Laid-Open No. 329715/1999 discloses a flexible substrate for an organic device which is a not more than 200 µm-thick composite structure comprising a thin glass layer and a plastic layer. Published Japanese Translation of PCT Publication No. 534305/2002 discloses a glass/plastic composite film comprising a 1 to 200 µm-thick polymer layer provided on at least one surface of a 10 to 500 µm-thick glass film. Further, Japanese Patent Laid-Open No. 50565/2004 discloses a thin sheet substrate comprising an inorganic glass layer and a resin layer formed of a composition composed mainly of a metal oxide polymer. The claimed advantage of the thin sheet substrate disclosed in Japanese Patent Laid-Open No. 50565/2004 is to have a high heat resistance temperature, i.e., substantially no thermogravimetric reduction up to a temperature around 400° C., gas barrier properties on a level comparable with the glass, a high level of transparency to visible light, and a high level of flexibility of 6 mm in terms of limit curvature radius.

The flexible substrate disclosed in Japanese Patent Laid-Open No. 329715/1999, however, disadvantageously has low heat resistance. The composite film disclosed in Published Japanese Translation of PCT Publication No. 534305/2002 has high heat resistance. However, the heat resistant temperature is not yet satisfactory and is about 280° C. Therefore, the step of preparing a device element on the composite film is disadvantageously limited to 280° C. or below, and the low heat resistance of the film poses a problem, for example, in the film formation of a transparent electrode of indium tin oxide (ITO) or the like. The resin layer formed of the composition composed mainly of the metal oxide polymer constituting the thin sheet substrate disclosed in Japanese Patent Laid-Open No. 50565/2004 is disadvantageously easily swollen or dissolved in an organic solvent, particularly an aromatic organic solvent. Specifically, in the production of an organic device, for example, when an organic EL element is produced using the substrate disclosed in Japanese Patent Laid-Open No. 50565/2004, a transparent electrode of ITO or the like is formed in a predetermined pattern as an anode on a resin layer formed of a composition composed mainly of a metal oxide polymer stacked onto a glass layer. In this case, the resin layer as the underlying layer is exposed from between the patterned transparent electrode. When an organic EL layer is formed by a wet coating process such as a spin coating method, the resin layer as the underlying layer exposed from between the transparent electrode pattern is disadvantageously swollen or dissolved in the aromatic organic solvent dissolving the organic EL layer. Therefore, the thin sheet substrate disclosed in Japanese Patent Laid-Open No. 50565/2004 cannot be used in a production process using a solvent such as an aromatic organic solvent, and, in polymeric organic EL materials, which are dissolved in a solvent such as an aromatic organic solvent to prepare a solution for coating, and coatable low-molecular weight organic EL materials, disadvantageously, film formation by highly productive and practical wet coating methods, such as ink jet recording, printing, spin coating, and dipping, cannot be carried out.

DISCLOSURE OF THE INVENTION

As a result of extensive and intensive studies, the present inventors have found that it is possible to provide a flexible substrate, which has solvent resistance, a high level of gas barrier properties, excellent flexibility, high heat resistance, and high transparency and is suitable, e.g., for use in a wet coating process of an organic device material, and to provide an organic device using the same. The present invention has been made based on such finding.

According to one aspect of the present invention, there is provided a flexible substrate comprising: a very thin glass; and a layer containing a metal oxide polymer and a three dimensionally crosslinked polymer layer stacked in that order on at least one side of the very thin glass.

In a preferred embodiment of the present invention, there is provided a flexible substrate in which the very thin glass has a thickness of not less than 1 μm and not more than 200 μm and, the metal oxide polymer-containing layer has a thickness of not less than 0.1 μm and not more than 200 μm, preferably not less than 1 μm and not more than 100 μm and is stable against heat treatment at a temperature of 350° C. or above and 500° C. or below in air.

According to another aspect of the present invention, there is provided an organic device produced by coating a solution of an organic device material in an aromatic organic solvent onto a flexible substrate by a wet coating method, said flexible substrate being one according to the present invention.

The flexible substrate of the present invention has solvent resistance suitable as a substrate for an organic device, gas barrier properties comparable with glass, and has an excellent flexibility of not more than 10 mm in terms of limit curvature radius, and the metal oxide polymer-containing layer constituting the flexible substrate can withstand heat treatment at a temperature of 350° C. or above and 500° C. or below in the air and is stable and remain substantially unchanged in transparency in a visible region even after the heat treatment step and thus is a flexible substrate for an organic device having excellent properties. Further, when the flexible substrate according to the present invention is used in the production of an organic device, a solution of an organic device material dissolved in an aromatic organic solvent can be coated onto the flexible substrate by a wet coating process, contributing to the production of a high-quality and low-cost organic device.

Figure 1:
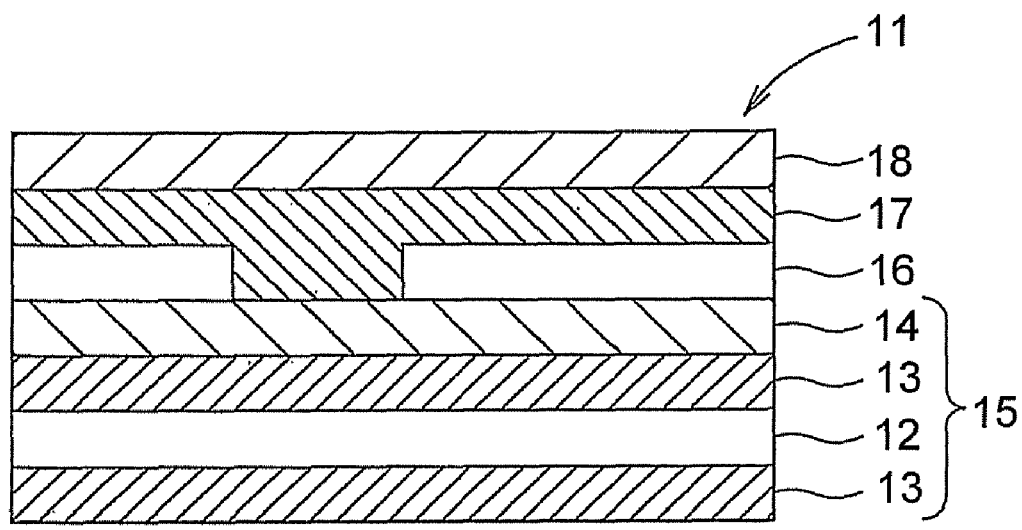
FIG. 1 is a cross-sectional view showing a layer construction using the flexible substrate according to the present invention in an organic EL element.

DESCRIPTION OF REFERENCE CHARACTERS 11, 21: organic EL element,
12, 22: glass layer,
13, 23: metal oxide polymer-containing layer,
14, 24: three-dimensionally crosslinked polymer layer,
15, 25: flexible substrate,
16, 26: transparent anode,
17, 27: organic EL luminescent layer, and
18, 28: cathode.

DETAILED DESCRIPTION OF THE INVENTION

Embodiments of the flexible substrate according to the present invention will be described with reference to the accompanying drawings.

Figure 2:
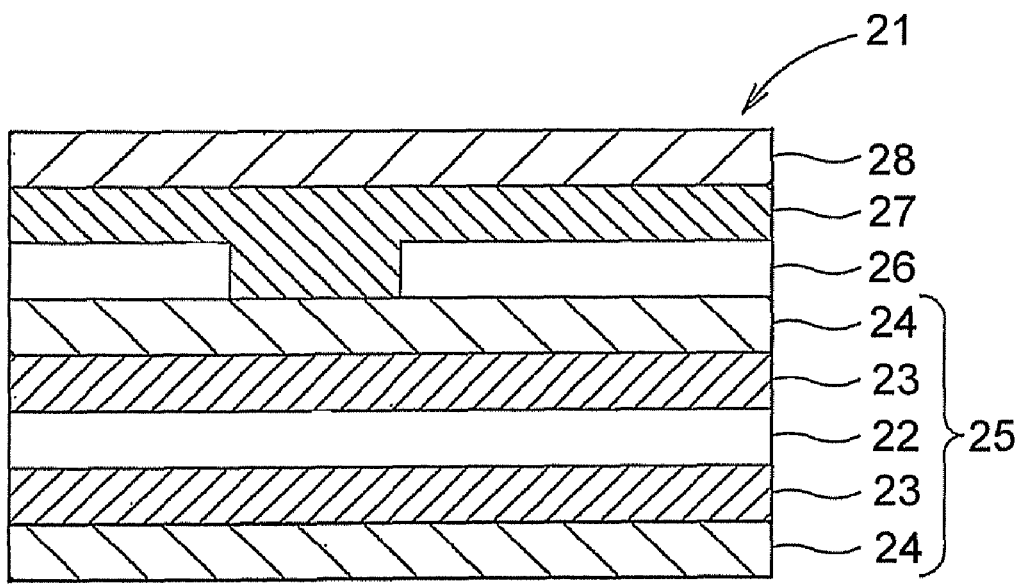
FIG. 2 is a cross-sectional view showing a layer construction in another embodiment of the use of the flexible substrate according to the present invention in an organic EL element.

FIGS. 1 and 2 are cross-sectional views of a layer construction in the case where the flexible substrate according to the present invention is used in an organic EL element. FIG. 1 is an embodiment in which a three-dimensionally crosslinked polymer layer 14 is provided on one side (inner side) of a metal oxide polymer-containing layer 13, and FIG. 2 is an embodiment in which a three-dimensionally crosslinked polymer layer 24 is provided on both sides of a metal oxide polymer-containing layer 23. In FIGS. 1 and 2, both organic EL layers 17 and 27 have a single-layer structure. The organic layer part may have a multilayer structure of a combination of two or more layers of the EL layer and, in addition, a hole injection layer, an electron injection layer, a hole transport layer, and an electron transport layer as in the conventional organic EL device.

As shown in FIG. 1, an organic EL element 11 includes a flexible substrate 15. The flexible substrate 15 comprises a glass layer 12 of a very thin glass, a metal oxide polymer-containing layer 13, and a three-dimensionally crosslinked polymer layer 14 provided on one side (inner side) of the metal oxide polymer-containing layer 13. A transparent anode 16 of ITO or the like, an organic EL luminescent layer 17, and a cathode 18 are provided on the flexible substrate 15.

Very Thin Glass

The very thin glass constituting the glass layer 12 according to the present invention is preferably an inorganic glass having various compositions with a thickness of not less than 1 μm and not more than 200 μm, more preferably an alkali-free glass. The flexible substrate according to the present invention comprises a metal oxide polymer-containing layer. Preferably, the metal oxide polymer-containing layer has a multilayer structure of two or more layers.

Metal Oxide Polymer-Containing Layer

The metal oxide polymer according to the present invention may be prepared by hydrolysis and condensation of various metal alkoxides. Metal elements constituting the metal alkoxide include Si (silicon), Ti (titanium), Ge (germanium), Zr (zirconium), Al (aluminum), In (indium), Sn (tin), Ta (tantalum), Zn (zinc), W (tungsten), and Pb (lead). Further, two or more of these metal alkoxides may be used as a mixture at any mixing ratio.

The metal alkoxide is not particularly limited so far as it contains the above metal element and can be hydrolyzed and condensed to give a metal oxide polymer. The metal alkoxide is preferably a silicon oxide polymer, particularly preferably a metal alkoxide that can provide a silicon oxide oligomer having a cage-type molecular shape and a silicon oxide polymer having ladder-type molecular shape called "silsesquioxane" or "polysilsesquioxane."

Metal alkoxides for providing silicon oxide polymers by hydrolysis and condensation include, for example, tetraalkoxysilanes, such as tetramethoxysilane and tetraethoxysilane; aryl trialkoxysilanes, such as phenyl trimethoxysilane and phenyl triethoxysilane; alkyl trialkoxysilanes, such as methyl trimethoxysilane, ethyl trimethoxysilane, 3-mercaptopropyl trimethoxysilane, methyl triethoxysilane, and ethyl triethoxysilane; arylalkyl dialkoxysilanes, such as phenylmethyl dimethoxysilane, phenylethyl dimethoxysilane, phenylmethyl diethoxysilane, and phenylethyl diethoxysilane; dialkyl dialkoxysilanes, such as dimethyl dimethoxysilane, diethyl dimethoxysilane, dimethyl diethoxysilane, and diethyl diethoxysilane; diarylalkyl alkoxysilanes or aryidialkyl alkoxysilanes, such as diphenylmethyl methoxysilane, phenyldimethyl methoxysilane, diphenylethyl methoxysilane, phenyldiethyl methoxysilane, diphenylmethyl ethoxysilane, phenyldimethyl ethoxysilane, diphenylethyl methoxysilane, and phenyldiethyl ethoxysilane; triaryl alkoxysilanes, such as triphenyl methoxysilane and triphenyl ethoxysilane; and trialkyl alkoxysilanes, such as trimethyl methoxysilane, triethyl methoxysilane, trimethyl ethoxysilane, and triethyl ethoxysilane.

In the present invention, the molecular weight of the metal oxide polymer is not particularly limited. Preferably, however, the weight average molecular weight is 5000 to 1000000 as determined using polystyrene as a standard. The metal oxide polymer according to the present invention is an organic-inorganic hybrid polymer having a high level of heat resistance that has substantially no thermogravimetric reduction up to a temperature around 500° C.

The metal oxide polymer-containing layer according to the present invention is composed mainly of the metal oxide polymer. The metal oxide polymer according to the present invention may be prepared as a solution of the metal oxide polymer in a solvent. Water and various organic solvents may be used as the solvent.

In the present invention, the metal oxide polymer-containing layer 13 may further comprise a conventional organic resin such as an acrylic resin, an epoxy resin, a urethane resin, a melamine resin, polyimide, polycarbonate, polyacetal, polyvinyl butyral, or polyvinyl pyrrolidone. In this connection, it should be noted that, since the metal oxide polymer is the main component, the organic resin is contained in the composition in such an amount range that the metal oxide polymer constitutes the main component.

In the present invention, the metal oxide polymer-containing layer 13 may contain an organic low-molecular weight compound instead of or together with the organic resin.

The metal oxide polymer solution may be coated onto the very thin glass by various conventional wet coating methods such as rotary coating, dip/pull-up coating, and various printing methods. Among them, the dip/pull-up coating method is advantageous, for example, in that the mechanical pressure applied to the very thin glass is low and both sides of the very thin glass can be coated at a time.

In the case of the dip/pull-up coating method, the thickness of the metal oxide polymer-containing layer 13 may be regulated by properly regulating the concentration of the metal oxide polymer solution, the pull-up speed, and the temperature at the time of pull-up. In order to provide gas barrier properties and flexibility which are desired as a flexible substrate for an organic device, however, the thickness of the metal oxide polymer-containing layer 13 coated onto one side of the very thin glass is 0.1 to 200 µm, more preferably 0.1 to 200 µm, per layer. The metal oxide polymer-containing layer 13 according to the present invention may have a multilayer structure of two or more using different metal oxide polymers.

After the metal oxide polymer solution is coated, the coating is dried and heat treated in an oven at 50 to 500° C. to remove the solvent to form a metal oxide polymer-containing layer 13.

Three-Dimensionally Crosslinked Polymer Layer

In the present invention, a three-dimensionally crosslinked polymer layer 14 is formed on the metal oxide polymer-containing layer 13. In FIG. 1, the three-dimensionally crosslinked polymer layer 14 is formed on one side of the metal oxide polymer-containing layer 13. As shown in FIG. 2, however, the three-dimensionally crosslinked polymer layer 24 may be formed on both sides of the metal oxide polymer-containing layer 23.

The three-dimensionally crosslinked polymer layer 14 according to the present invention is a layer that has a high level of transparency and solvent resistance, has a pencil hardness of H or more, and a flexibility of not less than 10 mm in terms of limit curvature radius. Accordingly, according to another aspect of the present invention, there is provided a flexible substrate in which the metal oxide polymer-containing layer underlying the three-dimensionally crosslinked polymer layer is not swollen and/or dissolved in an aromatic organic solvent.

The thickness of the three-dimensionally crosslinked polymer layer 14 is preferably 0.1 to 30 µm. When the thickness of the three-dimensionally crosslinked polymer layer 14 is less than 0.1 µm, the solvent resistance as the three-dimensionally crosslinked polymer layer 14 is not satisfactory. On the other hand, when the thickness of the three-dimensionally crosslinked polymer layer 14 is more than 30 µm, disadvantageously, cracking or separation occurs in the three-dimensionally crosslinked polymer layer 14, or curling is likely to occur in the three-dimensionally crosslinked polymer layer 14. In the present invention, the three-dimensionally crosslinked polymer layer 14 may have a single-layer structure or a multilayer structure.

Materials usable for three-dimensionally crosslinked polymer layer 14 formation include ionizing radiation curing resins and heat curing resins. Ionizing radiation curing resins are preferred because of easy formation of a film on a plastic substrate film. For materials for three-dimensionally crosslinked polymer layer 14 formation, higher heat resistance is more preferred.

Ionizing radiation curing resins usable in the three-dimensionally crosslinked polymer layer 14 include, for example, polyester acrylate, urethane acrylate, and polysiloxane organic silicones. Preferably, the polyester acrylate comprises acrylate or methacrylate of oligomer of a polyester polyol (acrylate and/or methacrylate as used herein being hereinafter referred to simply as "meth(acrylate)") or a mixture thereof. The urethane acrylate is prepared by acrylating an oligomer comprising a polyol compound and a diisocyanate compound.

Monomers constituting the acrylate include methyl(meth)acrylate, ethyl(meth)acrylate, butyl(meth)acrylate, 2-ethylhexyl(meth)acrylate, methoxyethyl(meth)acrylate, butoxyethyl(meth)acrylate, and phenyl(meth)acrylate.

Polyfunctional monomers usable in combination with the acrylate include, for example, trimetylolpropane tri(meth)acrylate, hexanediol(meth)acrylate, tripropylene glycol di(meth)acrylate, diethylene glycol di(meth)acrylate, pentaerythritol tri(meth)acrylate, dipentaerythritol hexa(meth)acrylate, 1,6-hexanediol di(meth)acrylate, and neopentyl glycol di(meth)acrylate.

Polyester oligomers include polyadipate polyols and polysebacate polyols which are condensates of adipic acid with glycols (ethylene glycol, polyethylene glycol, propylene glycol, polypropylene glycol, butylene glycol, and polybutylene glycol), adipic acid with triols (for example, glycerin and trimetylolpropane), sebacic acid with glycols, or sebacic acid with triols. The aliphatic dicarboxylic acids may be partially or entirely substituted by other organic acid. For example, isophthalic acid, terephthalic acid, phthalic anhydride and the like may be used as the constituent.

The polyurethane oligomer may be prepared from a product of condensation of polyisocyanate with polyol. For example, the polyurethane oligomer may be produced by reacting a compound, selected from methylene-bis(p-phenylene diisocyanate) adduct, hexamethylene diisocyanate-hexane triol adduct, hexamethylene diisocyanate, tolylene diisocyanate, and tolylene diisocyanate trimethylolpropane adducts, 1,5-naphthylene diisocyanate, thiopropyl diisocyanate, ethylbenzene-2,4-diisocyanate, and 2,4-tolylene diisocyanate dimers, hydrogenated xylylene diisocyanate, tris(4-phenylisocyanate)thiophosphate and the like, with the following polyol. Examples of polyols include polyether polyols such as polyoxytetramethylene glycol, polyester polyols such as polyadipate polyols and polycarbonate polyols, and copolymer of acrylic esters with hydroxyethyl methacrylates.

Further, when the ionizing radiation curing resin is used as an ultraviolet curing resin, photopolymerization initiators such as acetophenones, benzophenones, Michler's benzoyl benzoate, α-amyloxime esters, and thioxanthones, and photosensitizers such as n-butylamine, triethylamine, and tri-n-butylphosphine may be mixed in the ultraviolet curing resin.

The urethane acrylate is highly elastic and flexible and has excellent workability (folding properties). Hardness may be imparted to the polyester acrylate by selecting the constituent of the polyester. In order to form a flexible three-dimensionally crosslinked polymer layer, mixing of 60 to 90 parts of urethane acrylate and 40 to 10 parts of polyester acryate is suitable for providing hardness and flexibility.

The three-dimensionally crosslinked polymer layer 14 preferably comprises a polysiloxane organic silicone. The polysiloxane organic silicone may be provided by providing a solution of a polysiloxane organic silicone in an organic solvent, coating the solution, then thermally crosslinking the coating, or by coating a coating composition comprising, as raw materials, at least a silane coupling agent containing an organic functional group and a hydrolyzable group and a crosslinkable compound containing an organic functional group reactive with the organic functional group in the silane coupling agent.

Silane coupling agents containing an organic functional group and a hydrolyzable group include, for example, aminoalkyl dialkoxysilane or aminoalkyl trialkoxysilane.

Specific examples of aminoalkyl dialkoxysilanes or aminoalkyl trialkoxysilanes include N-β-(aminoethyl)γ-aminopropyl trimethoxysilane, N-β-(aminoethyl)γ-aminopropyl triethoxysilane, N-β-(aminoethyl)γ-aminopropyl triisopropoxysilane, N-β-(aminoethyl)γ-aminopropyl tributoxysilane, N-β-(aminoethyl)γ-aminopropylmethyl dimethoxysilane, N-β-(aminoethyl)γ-aminopropylmethyl diethoxysilane, N-β-(aminoethyl)γ-aminopropylmethyl diisopropoxysilane, N-β-(aminoethyl)γ-aminopropylmethyl dibutoxysilane, N-β-(aminoethyl)γ-aminopropylethyl dimethoxysilane, N-β-(aminoethyl)γ-aminopropylethyl diethoxysilane, N-β-(aminoethyl)γ-aminopropylethyl diisopropoxysilane, N-β-(aminoethyl)γ-aminopropylethyl dibutoxysilane, γ-aminopropyl trimethoxysilane, γ-aminopropyl triethoxysilane, γ-aminopropyl triisopropoxysilane, γ-aminopropyl tributoxysilane, γ-aminopropylmethyl dimethoxysilane, γ-aminopropylmethyl diethoxysilane, γ-aminopropylmethyl diisopropoxysilane, γ-aminopropylmethyl dibutoxysilane, γ-aminopropylethyl dimethoxysilane, γ-aminopropylethyl diethoxysilane, γ-aminopropylethyl diisopropoxysilane, γ-aminopropylethyl dibutoxysilane, and γ-aminopropyl triacetoxysilane. They may be used solely or in a combination of two or more of them.

The crosslinkable compound containing an organic functional group reactive with the organic functional group contained in the silane coupling agent is a compound containing a glycidyl, carboxyl, isocyanate, oxazoline group or the like which is a functional group reactive with the amino group. Specific examples thereof include: diglycidyl ethers, such as ethylene glycol diglycidyl ether, diethylene glycol diglycidyl ether, triethylene glycol diglycidyl ether, tetraethylene glycol diglycidyl ether, nonaethylene glycol diglycidyl ether, propylene glycol diglycidyl ether, dipropylene glycol diglycidyl ether, tripropylene glycol diglycidyl ether, 1,6-hexanediol diglycidyl ether, neopentyl glycol diglycidyl ether, adipic acid diglycidyl ether, o-phthalic acid diglycidyl ether, and glycerol diglycidyl ether; triglycidyl ethers, such as glycerol triglycidyl ether, diglycerol triglycidyl ether, triglycidyl tris (2-hydroxyethyl)isocyanurate, and trimethylolpropane triglycidyl ether; tetraglycidyl ethers, such as pentaerythritol tetraglycidyl ether; other polyglycidyl ethers or polymers containing a glycidyl group as a functional group; dicarboxylic acids, such as tartaric acid and adipic acid; carboxyl-containing polymers such as polyacrylic acid; isocyanates, such as hexamethylene diisocyanate and xylylene diisocyanate; oxazoline-containing polymers; and alicyclic epoxy compounds. They may be used solely or in a combination of two or more of them. A compound containing two or more glycidyl groups is preferred from the viewpoint of reactivity.

The amount of the crosslinkable compound used is preferably 0.1 to 300% (on a mass basis; the same shall apply hereinafter), more preferably 1 to 200%, based on the silane coupling agent. When the amount of the crosslinkable compound is less than 0.1%, the flexibility of the coating is is unsatisfactory. On the other hand, when the amount of the crosslinkable compound exceeds 300%, the gas barrier properties are likely to be lowered. The silane coupling agent and the crosslinkable compound are stirred optionally with heating to prepare a coating composition.

The three-dimensionally crosslinked polymer layer 14 formed of a polysiloxane organic silicone is formed by coating a coating composition comprising a silane coupling agent and a crosslinkable compound as raw materials onto the metal oxide polymer-containing layer 13 and drying the coating to allow the hydrolysis and condensation of the siliane coupling agent and the crosslinking of the crosslinkable compound to proceed. After coating, the coating may be heated and dried to form the three-dimensionally crosslinked polymer layer 14.

The composition may further contain a silane compound that contains a hydrolyzable group and does not contain an organic functional group such as an amino group. Specific examples of such silane compounds include tetramethoxysilane, tetraethoxysilane, tetraisopropoxysilane, tetrabutoxysilane, methyltrimethoxysilane, methyltriethoxysilane, metyltriisopropoxysilane, methyltributoxysilane, ethyltrimethoxysilane, ethyltriethoxysilane, ethyltriisopropoxysilane, ethyltributoxysilane, dimethyldimethoxysilane, dimethyldiethoxysilane, dimetyldiisopropoxysilane, dimethyldibutoxysilane, diethyldimethoxysilane, diethyldiethoxysilane, diethyldiisopropoxysilane, diethyldibutoxysilane, vinyltrimethoxysilane, vinyltriethoxysilane, γ-glycidoxypropyltrimethoxysilane, γ-glycidoxypropyltriethoxysilane, γ-methacryloxypropyltrimethoxysilane, γ-chloroxypropyltrimethoxysilane, and γ-mercaptopropyltrimethoxysilane. They may be used solely or in a combination of two or more of them.

When the composition contains a silane compound that contains a hydrolyzable group and does not contain an organic functional group such as an amino group, cohydrolysis and condensation with the silane coupling agent containing an organic functional group such as an amino group and a hydrolyzable group and the crosslinking of the crosslinkable compound proceed to form a coating of polysiloxane having a crosslinked structure.

The coating composition may further contain a silane coupling agent containing an organic functional group such as an amino group and a hydrolyzable group and/or a hydrolysis condensate of a silane compound containing a hydrolyzable group and not containing an organic functional group such as an amino group. If necessary, various inorganic or organic additives such as silane compounds other than the above compounds, solvents, curing catalysts, wetting improvers, plasticizers, antifoaming agents, and thickeners may be further added to the coating composition.

The coating solution for three-dimensionally crosslinked polymer layer 14 formation may be coated by a conventional method depending upon the properties and coverage of the coating composition, for example, roll coating, gravure coating, bar coating, or extrusion coating to form a three-dimensionally crosslinked polymer layer 14. Thus, the flexible substrate 15 for an organic device according to the present invention is prepared.

Applications

The flexible substrate 15 according to the present invention may be utilized as an organic device, for example, as a substrate for a flat panel display such as an organic EL display or a liquid crystal display, or as a substrate for a flexible organic electronic device such as an organic thin film transistor.

The flexible substrate 15 thus obtained has gas barrier properties comparable with conventional glass substrates and an excellent flexibility of not more than 10 mm in terms of limit curvature radius that render the flexible substrate suitable as a display substrate. The metal oxide polymer-containing layer 13 constituting the flexible substrate 15 has heat resistance high enough to withstand a high temperature process of 300° C. or above and stability high enough to cause substantially no lowering in transmittance in a visible region even after heat treatment at a temperature of 350° C. or above and 500° C. or below in the air.

In the present invention, "transparency" of the member means that the transmittance is high in the wavelength region used in the organic device, for example, in the case of a display device, the transmittance is not less than 80% in a visible wavelength region, and, the case of an optoelectronic device or the like, the transmittance is satisfactory for utilization in the wavelength region used in the device.

EXAMPLES

The following Examples further illustrate but do not limit the present invention.

Example 1

One part by weight of a phenyltrimethoxysilane hydrolysis condensate polymer was dissolved in 99 parts by weight of toluene to prepare a coating liquid. A 50 μm-thick very thin borosilicate glass was immersed in the coating liquid, was pulled up slowly at room temperature, was then immediately dried in an oven of 80° C. for 3 hr, and was then heat treated at 400° C. for 30 min to prepare a substrate comprising a 10 μm-thick (thickness on one side) silicon oxide polymer layer provided on both sides of the very thin glass.

Next, a solution of a polysiloxane organic silicone in isobutyl alcohol/ethoxyethyl acetate was spin coated onto the silicon oxide polymer layer located on one side of the substrate, and the coating was thermally crosslinked at 150° C. for 60 min to form a 0.1 μm-thick three-dimensionally crosslinked polymer layer to prepare a flexible substrate comprising a three-dimensionally crosslinked polymer layer provided on one side of the silicon oxide polymer-containing layer.

The flexible substrate thus obtained had a thickness of 72 μm, a limit curvature radius of 7 mm, and a transmittance of 95% at 600 nm.

Example 2

In the same manner as in Example 1, one part by weight of a phenyltrimethoxysilane hydrolysis condensate polymer was dissolved in 99 parts by weight of toluene to prepare a coating liquid. A 50 μm-thick very thin borosilicate glass was immersed in the coating liquid, was pulled up slowly at room temperature, was then immediately dried in an oven of 80° C. for 3 hr, and was then heat treated at 400° C. for 30 min to prepare a substrate comprising a 10 μm-thick (thickness on one side) silicon oxide polymer layer provided on both sides of the very thin glass.

Next, an ionizing radiation curing resin ("PETD-31" manufactured by Dainichiseika Color & Chemicals Manufacturing Co., Ltd.) was spin coated on the silicon oxide polymer layer located on one side of the substrate to a thickness of 5 μm on a dry basis, and the coating was irradiated with electron beams under conditions of accelerating voltage 175 KV and exposure dose 10 Mrad to cure the coating and thus to form a 5 μm-thick three-dimensionally crosslinked polymer layer. Thus, a flexible substrate comprising a three-dimensionally crosslinked polymer layer provided on one side of the silicon oxide polymer-containing layer was prepared.

The flexible substrate thus obtained had a thickness of 75 μm, a limit curvature radius of 7 mm, and a transmittance of 95% at 600 nm.

Example 3

A substrate comprising a 10-μm thick (thickness on one side) silicon oxide polymer layer provided on both sides of a very thin glass was prepared in the same manner as in Example 1, except that phenylmethoxysilane and 3-mercaptopropyltrimethoxysilane hydrolysis condensate copolymer were used.

Next, a solution of an ultraviolet curing resin ("Seika Beam EXG 40" manufactured by Dainichiseika Color & Chemicals Manufacturing Co., Ltd.) in toluene as a solvent was roll coated on both sides of the substrate to a thickness of 5 μm on a dry basis, and the ultraviolet curing resin was cured with a high pressure mercury lamp to form a 5 μm-thick three-dimensionally crosslinked polymer layer, whereby a flexible substrate comprising a three-dimensionally crosslinked polymer layer provided on both sides of the silicon oxide polymer-containing layer was formed.

The flexible substrate thus obtained had a thickness of 80 μm, a limit curvature radius of 9 mm, and a transmittance of 95% at 600 nm.

Example 4

The 72 μm-thick flexible substrate prepared in Example 1 was provided. A thin film (thickness 30 nm) of indium tin oxide (ITO) for a transparent anode was formed by a magnetron sputtering process on the flexible substrate.

A photosensitive resist (OFPR-800 manufactured by Tokyo Ohka Kogyo Co., Ltd.) was then coated on the anode. The coating was exposed through a mask, and the exposed coating was developed (with NMD 3 manufactured by Tokyo Ohka Kogyo Co., Ltd.) and was etched to form an anode pattern.

PEDOT/PSS (Bayer CH8000 manufactured by Bayer) was then spin coated to a thickness of 80 nm, and the coating was fired at 160° C. to form a hole injection layer.

A coating liquid for organic EL layer formation having the following composition was then prepared and was spin coated onto the above PEDOT to a thickness of 80 nm, and the coating was dried at 130° C. to form a luminescent layer (thickness 80 nm).

Preparation of Coating Liquid or Organic EL Layer Formation

| | |
|---|---|
| Polyvinylcarbazole | 70 pts. wt. |
| Oxadiazole compound | 30 pts. wt. |
| Fluorescent dye | 1 pts. wt. |
| Monochlorobenzene (solvent) | 4900 pts. wt. |

When the fluorescent dye is coumarin, green luminescence with a peak at 501 nm is provided; when the fluorescent dye is perylene, blue luminescence with a peak at 460 to 470 nm is provided; and when the fluorescent dye is DCM (dicyanomethylene pyran derivative), red luminescence with a peak at 570 nm is provided. These fluorescent dyes were used as luminescent materials for respective colors.

Next, an aluminum thin film (thickness 100 nm) was formed as a cathode by a magnetron sputtering process to prepare an organic EL device.

In the organic EL device prepared in this Example, the silicon oxide polymer layer is covered with the three-dimensionally crosslinked polymer layer. Therefore, in the organic EL layer formation, the silicon oxide polymer layer is neither swollen nor dissolved in an aromatic organic solvent, and the organic EL layer can be formed by a wet coating process.

The invention claimed is:

1. A flexible substrate comprising: a very thin glass; a silicon oxide polymer-containing layer and a three dimensionally crosslinked polymer layer stacked in that order on at least one side of the very thin glass, wherein the silicon oxide polymer-containing layer comprises a phenyltrimethoxysilane hydrolysis condensate polymer or a phenylmethoxysilane and 3-mercaptopropyltrimethoxysilane hydrolysis condensate polymer, and wherein the three dimensionally crosslinked polymer layer is a thermally crosslinked polysiloxane organic silicone.

2. The flexible substrate according to claim 1, wherein said very thin glass has a thickness of not less than 1 μm and not more than 200 μm and
said silicon oxide polymer-containing layer has a thickness of not less than 0.1 μm and not more than 200 μm, and which is stable against heat treatment at a temperature of 350° C. or above and 500° C. or below in air.

3. The flexible substrate according to claim 1, wherein said silicon oxide polymer-containing layer underlying said three-dimensionally crosslinked polymer layer is not swollen and/or dissolved in an aromatic organic solvent.

4. An organic device produced by coating a solution of an organic device material in an aromatic organic solvent onto a flexible substrate by a wet coating method,
said flexible substrate being one according to claim 1.

5. The organic device according to claim 4, wherein said organic device is an organic electroluminescent device.

* * * * *